(12) United States Patent
Deguenther et al.

(10) Patent No.: US 10,216,091 B2
(45) Date of Patent: Feb. 26, 2019

(54) FACET MIRROR FOR AN ILLUMINATION OPTICAL UNIT FOR PROJECTION LITHOGRAPHY

(71) Applicant: Carl Zeiss SMT GmbH, Oberkochen (DE)

(72) Inventors: Markus Deguenther, Aalen (DE); Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/436,140

(22) Filed: Feb. 17, 2017

(65) Prior Publication Data

US 2017/0176865 A1 Jun. 22, 2017

Related U.S. Application Data

(63) Continuation of application No. PCT/EP2015/069020, filed on Aug. 19, 2015.

(30) Foreign Application Priority Data

Aug. 25, 2014 (DE) .......................... 10 2014 216 801

(51) Int. Cl.
*G03F 7/20* (2006.01)
*G02B 5/08* (2006.01)
*G02B 5/09* (2006.01)
*G21K 1/06* (2006.01)

(52) U.S. Cl.
CPC ....... *G03F 7/70075* (2013.01); *G02B 5/0891* (2013.01); *G02B 5/09* (2013.01); *G03F 7/702* (2013.01); *G03F 7/70033* (2013.01); *G03F 7/70116* (2013.01); *G21K 1/067* (2013.01)

(58) Field of Classification Search
CPC ..... G02B 5/0891; G02B 5/09; G03F 7/70033; G03F 7/70075; G03F 7/702; G21K 1/067
USPC ..................................................... 355/67, 71
See application file for complete search history.

(56) References Cited

U.S. PATENT DOCUMENTS

| 6,658,084 | B2 | 12/2003 | Singer |
| 7,858,957 | B2 | 12/2010 | Warm et al. |
| 2006/0132747 | A1 | 6/2006 | Singer et al. |
| 2007/0223112 | A1 | 9/2007 | Maim et al. |
| 2008/0123807 | A1 | 5/2008 | Warm et al. |

(Continued)

FOREIGN PATENT DOCUMENTS

| CN | 103842883 A | 6/2014 |
| DE | 103 17 667 A1 | 11/2004 |

(Continued)

OTHER PUBLICATIONS

International Search Report for corresponding PCT Appl No. PCT/EP2015/069020, dated Nov. 9, 2015.

(Continued)

*Primary Examiner* — Colin Kreutzer
(74) *Attorney, Agent, or Firm* — Fish & Richardson P.C.

(57) ABSTRACT

A facet mirror for an illumination optical unit for projection lithography has a plurality of used facets, which in each case reflect an illumination light partial beam. The facet mirror has at least one change subunit having a plurality of change facets arranged jointly on a facet carrier, which change facets can be positioned alternatively at the used location of exactly one used facet. This results in a facet mirror with which different illumination geometries or illumination settings can be set operationally reliably and stably.

22 Claims, 5 Drawing Sheets

(56) References Cited

U.S. PATENT DOCUMENTS

2010/0231882 A1    9/2010  Dinger et al.
2012/0293785 A1   11/2012  Kirch et al.
2014/0176928 A1    6/2014  Ruoff et al.

FOREIGN PATENT DOCUMENTS

DE    10 2006 014 380 A1   10/2007
DE    10 2012 207 048 A1    4/2013
DE    10 2012 223 754 A1    5/2014
DE    10 2013 212 363 A1    7/2014
EP          1 927 892 A1    6/2008

OTHER PUBLICATIONS

German Office Action, with translation thereof, for corresponding DE Appl No. 10 2014 216 801.5, dated May 7, 2015.
Chinese office action, with English translation, for corresponding application No. 201580045812.0, dated Jan. 3, 2018.

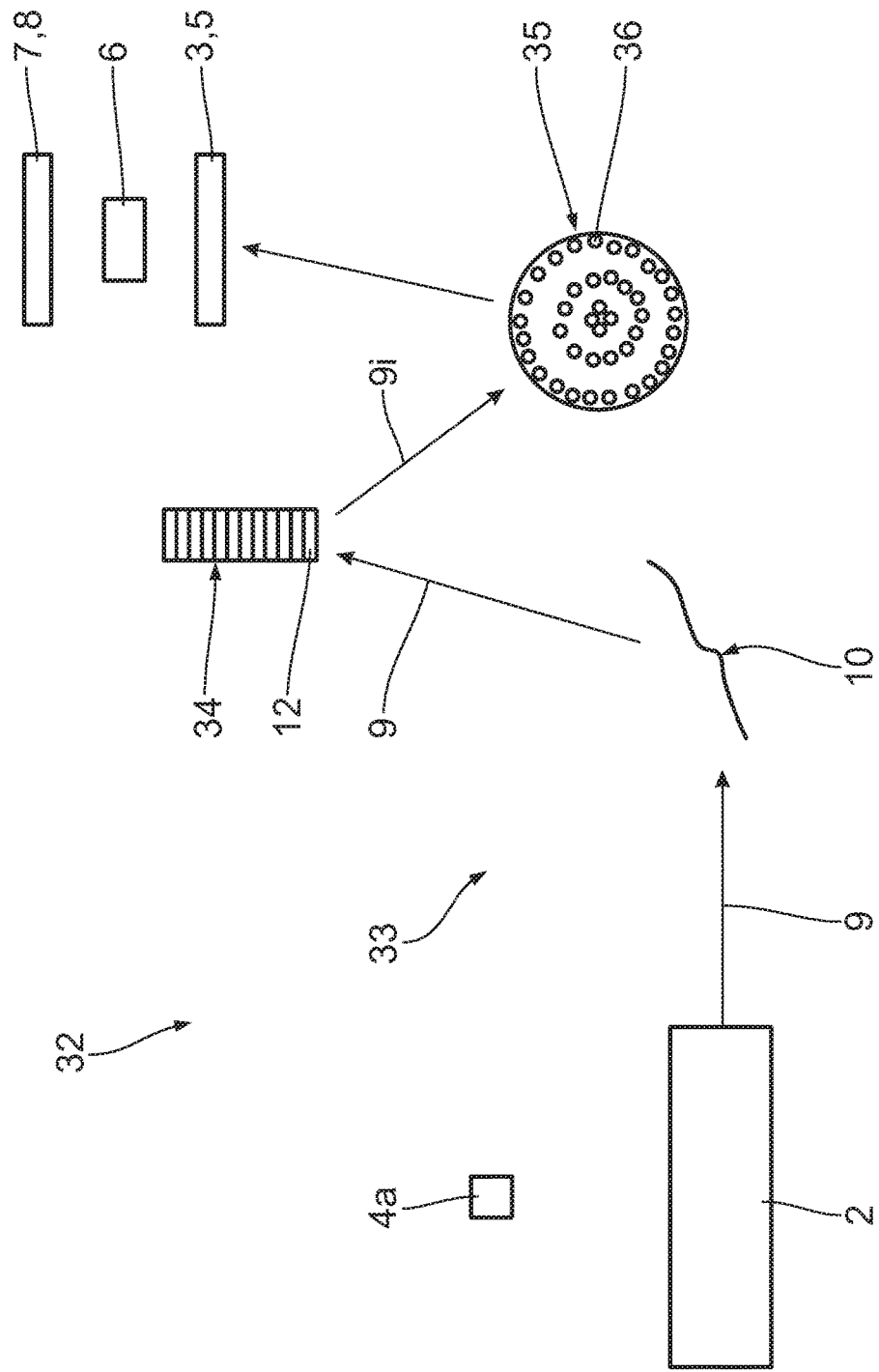

FACET MIRROR FOR AN ILLUMINATION OPTICAL UNIT FOR PROJECTION LITHOGRAPHY

CROSS-REFERENCE TO RELATED APPLICATIONS

The present application is a continuation of, and claims benefit under 35 USC 120 to, international application PCT/EP2015/069020, filed Aug. 19, 2015, which claims benefit under 35 USC 119 of German Application No. 10 2014 216 801.5, filed Aug. 25, 2014. The entire disclosure of international application PCT/EP2015/069020 and German Application No. 10 2014 216 801.5 are incorporated by reference herein.

FIELD

The disclosure relates to a facet mirror for an illumination optical unit for projection lithography. Furthermore, the disclosure relates to an illumination optical unit including such a facet mirror, an optical system and also an illumination system including such an illumination optical unit, a projection exposure apparatus including such an optical system, a method for producing a micro- or nanostructured component, and also a micro- or nanostructured component produced by such a method.

BACKGROUND

Facet mirrors for an illumination optical unit for projection lithography are known from EP 1 927 892 A1, U.S. Pat. No. 7,858,957 B2, US 2012/0 293 785 A1, U.S. Pat. No. 6,658,084 B2, DE 10 2006 014 380 A1, DE 103 17 667 A1, DE 10 2013 212 363 A1 and DE 10 2012 207 048 A1.

SUMMARY

The present disclosure seeks to develop a facet mirror such that different illumination geometries or illumination settings can be set operationally reliably and stably.

In one aspect, the disclosure provides a facet mirror for an illumination optical unit for projection lithography. The facet mirror includes a plurality of used facets which in each case reflect an illumination light partial beam. The facet mirror also includes at least one change subunit having a plurality of change facets arranged jointly on a facet carrier. The change facets can be positioned alternatively at a location of use of exactly one of the used facets According to the disclosure, it has been recognized that accommodating a plurality of change subunits on a common facet carrier of a change subunit results in the possibility of realizing stable and operationally reliable positioning of the respective used facets. Exchange between different change subunits, as discussed in EP 1 927 892 A1, is obviated. The used facets can differ with regard to their imaging properties and/or with regard to their direction-influencing properties and/or with regard to other parameters. The result is, in particular, a thermally loadable facet mirror. The number of change subunits can be exactly equal to the number of lines of the used facet arrangement. Alternatively, a smaller number of change subunits can also be provided if only a section of the used facet arrangement is intended to be equipped with changeable used facets. The change subunits can have individually assigned displacement actuators. A displacement of a change subunit ensures that exactly one of the used facets is changed for a change facet of the change subunit, which then becomes the alternative used facet. The positioning of all the other used facets remains unchanged independently of a displacement of the change subunit.

A distance between the used facet that is changeable via a change subunit and adjacent used facets that do not belong to this change subunit can be at most 2 mm. In the direction of such a distance between the used facet that is changeable via a change subunit and a used facet that does not belong to this change subunit, the adjacent used facets can have an extent which is at least five times this distance, such that the distance is therefore a maximum 20% of this used facet extent. This enables a practically uninterrupted packing of all the used facets of the facet mirror.

The change subunit can include at least one facet line in a line direction, wherein the change facets are arranged along the facet line, and wherein the used facets of the facet mirror are arranged transversely with respect to the line direction of the facet lines. Such an embodiment makes it possible to provide a practically unlimited number of change facets along the facet line of a change subunit. The number of predefinable illumination settings in which in each case a different used facet is used can be correspondingly great. Along the facet line, the change subunit can be embodied in a linearly displaceable fashion.

The change subunit can be embodied in a pivotable fashion, wherein the change facets are arranged in a circumferential direction around a pivoting axis. Such a pivotable change subunit leads to a stable and at the same time compact overall arrangement of the change subunits in the construction of the facet mirror. The pivotable change subunit can also be a change subunit that is rotatable by more than 360°. Exactly one change subunit embodied in a pivotable fashion can have two, three, four, five, six or even more change facets.

The change subunit can have a facet carrier having rotationally symmetrical wall sections by which adjacent change subunits can be placed against one another. Such an embodiment is particularly stable. The facet carrier can have, in particular, spherical walls. An axis of rotational symmetry of the wall sections can coincide with the pivoting or rotation axis of the respective change subunit. Alternatively and in particular in a configuration of the facet mirror including rectangular used facets, the facet carrier can also have planar walls via which adjacent change subunits can be placed against one another.

Pivotable change subunits can be arranged in a two-dimensional array. Such a configuration can be used for replacing conventional field facet mirrors whose field facets are arranged in a two-dimensional array. In this case, the field facets can have rectangular or curved reflection surfaces.

An illumination optical unit for projection lithography can include a facet mirror described herein.

An illumination optical unit can include a transfer facet mirror and a specular facet mirror arranged at a distance from a pupil plane. The facet mirror can be used as the transfer facet mirror or as the specular facet mirror.

An illumination optical unit can include a field facet mirror and a pupil facet mirror. The facet mirror can the field facet mirror.

An optical system for projection lithography can include an illumination optical unit including a facet mirror described herein. The optical system can illuminate an object field, in which an object to be illuminated can be arranged. The optical system can include a projection optical unit to image the object field into an image field. A projection exposure apparatus can include such an optical system and an EUV light source. The projection exposure apparatus can be used in a method to produce a structured component. An illumination system can include an EUV light source and an illumination optical unit including a facet mirror described herein. Advantages of such an optical system, such a projection exposure apparatus, such a method, such a structured component and such an illumination system correspond to those discussed above with reference to the facet mirror according to the disclosure and/or the illumination optical unit according to the disclosure. The structured component can be a micro- or nanostructured component, such as a semiconductor component, in particular a microchip, for example a memory chip.

BRIEF DESCRIPTION OF THE FIGURES

Exemplary embodiments of the disclosure are explained in greater detail below with reference to the drawing, in which:

FIG. 8 likewise shows highly schematically a further embodiment of an EUV illumination system of an EUV projection exposure apparatus including a field facet mirror and a pupil facet mirror.

DETAILED DESCRIPTION

Figure 1:
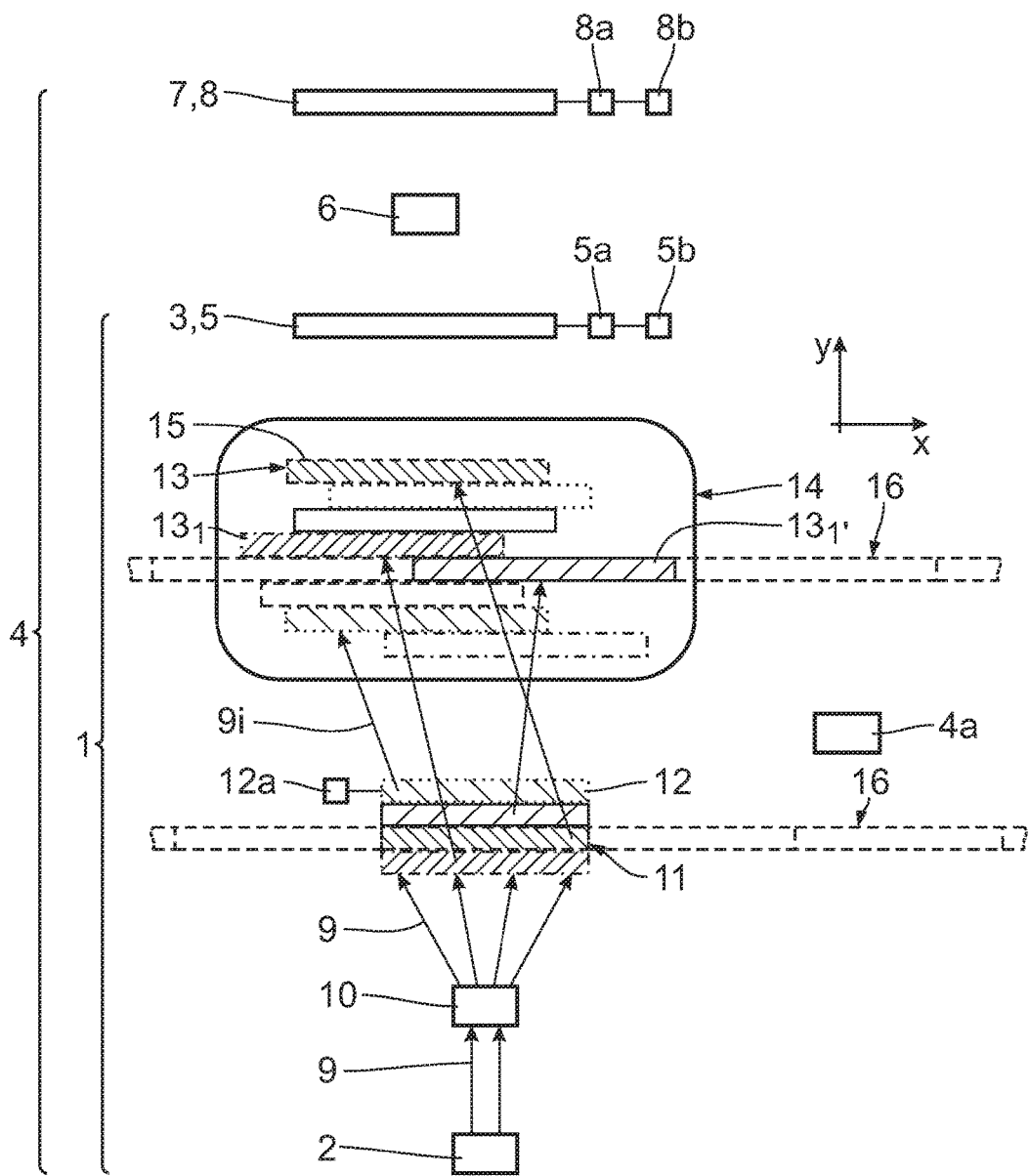
FIG. 1 shows highly schematically an EUV illumination system of an EUV projection exposure apparatus including an illumination optical unit including a transfer facet mirror and a specular facet mirror including in each case an indicated change subunit including a plurality of change facets.

An EUV illumination system 1 is illustrated schematically in FIG. 1 between an EUV light or radiation source 2 and an illumination field or object field 3. The EUV illumination system 1 is part of an EUV projection exposure apparatus 4 for producing highly integrated semiconductor components, in particular memory chips including structures in the nanometres range.

The illumination system 1 serves for the defined illumination of an illumination field. The illumination field can be larger than the actual object field 3, such that the object field 3 is arranged in the illumination field. Alternatively, the illumination field can coincide with the object field 3. In a further variant, the illumination field can be smaller than the object field 3 along an object or reticle displacement direction. The illumination field can be larger than the object field 3 perpendicular to the object displacement direction.

Figure 2:
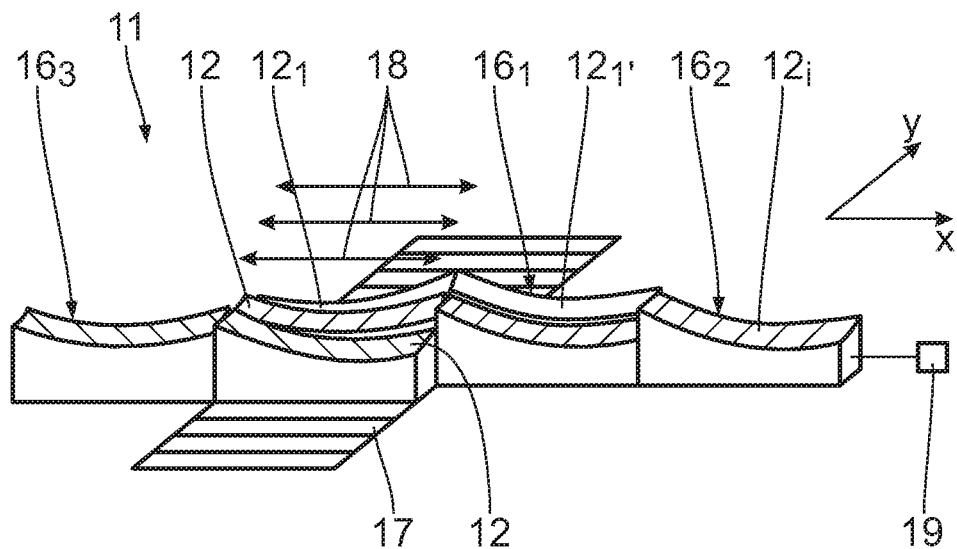
FIG. 2 shows in perspective view an excerpt from one of the facet mirrors, wherein sections of a total of three change subunits, each including a plurality of change facets, are illustrated.

In the embodiment according to FIG. 1, the radiation source according to FIG. 2 is a free electron laser (FEL). The light or radiation source 2 is an EUV (extreme ultraviolet) light source having an emitted used radiation in the range of between 5 nm and 30 nm. A wavelength band used for the EUV projection exposure or a target wavelength range of the EUV radiation is, for example, 13.5 nm±1 nm. The EUV radiation is also designated hereinafter as illumination and imaging light. A different target wavelength range, for example between 5 nm and 17 nm, is also possible. A bandwidth of the used EUV wavelength band can be between 0.1 nm and 2 nm. The light source 2 is a synchrotron source or a source based on a free electron laser (FEL). The light source 2 has an et endue that is less than $10^{-7}$ $m^2rad^2$. The et endue is the smallest volume of the phase space which contains 90% of the light energy.

The object field 3 is rectangular. Alternatively, the object field 3 can also be embodied in a ring-shaped fashion or in an arcuate fashion.

In the object field 3, a reflective reticle 5, also designated as a lithography mask, is arranged as the object to be illuminated and to be imaged. The reticle 5 is carried by a reticle holder 5a, which in turn is mechanically operatively connected to a reticle displacement device 5b.

The object field 3 is imaged into an image field 7 via a projection lens 6. An entrance pupil of the projection optical unit 6 can be situated in the beam path downstream of the object field 3. A section of a wafer 8 which has a layer that is light-sensitive to EUV illumination light 9 generated by the radiation source 2 is arranged in the image field 7. A section of the reticle 5 that lies in the object field 3 is imaged onto the wafer 8. The wafer 8 is also designated as a substrate. The wafer 8 is carried by a wafer holder 8a, which in turn is mechanically connected to a wafer displacement device 8b.

The EUV projection exposure apparatus 4 has a central control device 4a and is embodied in the manner of a scanner. In this case, a scanning direction runs parallel to short sides of the object field 3 and of the illumination field 7.

The components of the projection exposure apparatus 4 are all illustrated schematically in a plan view in FIG. 1. In this plan view, the object field 3 and the image field 7 are spanned by the coordinates x, y of a cartesian coordinate system. The x-direction runs towards the right in FIG. 1. The y-direction runs upwards in FIG. 1. An actual principal beam direction of illumination light 9 generated by the radiation source 2 runs substantially perpendicular to the xy-plane in the projection exposure apparatus 4.

The illumination light 9 emitted by the radiation source 2 is firstly shaped by a beam shaping device 10. This can involve an xy-scanner which fans out the illumination beam, emitted with low divergence by the radiation source 2, both in the x-direction and in the y-direction. The beam shaping device 10 makes it possible to select individually what effective x-extent and what effective y-extent a beam of the illumination light 9 has downstream of the beam shaping device 10. A driving of the beam shaping device 10 can be chosen such that one of the optical elements that follow in the beam path of the illumination light 9, in particular the next optical element in the beam path, and/or the object field 5 are/is illuminated homogeneously by the illumination light 9.

In an alternative embodiment, the beam shaping device 10 includes at least one stationary mirror which fans out the illumination light 9. The fan-out can be chosen such that one of the optical elements that follow in the beam path of the illumination light 9, in particular the next optical element in the beam path, and/or the object field 5 are/is illuminated homogeneously by the illumination light 9.

Insofar as the beam shaping device 10 is embodied as an xy-scanner, this embodiment can be such that only a small region of one of the optical components that succeed the beam shaping device 10 in the beam path of the illumination light 9 is illuminated at a point in time. As a result, when a highly coherent light source is used, in particular when an FEL is used, speckle can be reduced.

A transfer facet mirror 11 including transfer facets 12 is disposed downstream of the beam shaping device 10 in the beam path of the illumination light 9. The transfer facet mirror 11 is arranged in a field plane of the illumination system 1 which is optically conjugate with respect to an object plane of the object field 3. The transfer facets 12 are rectangular. A boundary shape of the object field 3 need not correspond to a boundary shape of the transfer facets 12. An x/y aspect ratio of the transfer facets 12 need not correspond to an x/y aspect ratio of the object field 3.

Illumination light partial beams 9$i$, which are reflected by a respective one of the transfer facets 12 impinge on specular facets 13 of a specular facet mirror 14, which is arranged in the beam path of the illumination light 9 downstream of the transfer facet mirror 11. The specular facet mirror 14 constitutes a specular reflector of the illumination system 1. The transfer facet mirror 11 and the specular facet mirror 14 are parts of an illumination optical unit of the illumination system 1 for illuminating the object field or illumination field 3. The illumination optical unit and the projection optical unit 6 are parts of an optical system of the projection exposure apparatus 4.

The specular facets 13 respectively used during the projection exposure are arranged alongside one another in the y-direction in an xy-arrangement plane of the specular facet mirror 14. The specular facets 13 serve for the reflective, superimposing guidance of the partial beams 9$i$ of the entire beam of the illumination light 9 towards the object field 3. Illumination channels are in each case predefined via the transfer facets 12 and the downstream specular facets 13 assigned via the reflective beam guidance of the illumination partial beams 9$i$. Via the illumination channels, the entire object field 3 is in each case illuminatable with the illumination light 9. A respective one of the object field illumination channels is assigned in each case exactly one transfer facet 12 and in each case exactly one specular facet 13. Alternatively, a respective one of the transfer facets can also be assigned to a plurality of illumination channels and thus to a plurality of specular facets 13.

As is known from the literature concerning the specular reflector, for example from DE 103 17 667 A1 or US 2010/0231882 A1, the specular facet mirror 14 is arranged such that a position of the respective specular facet 13 on the specular facet mirror 14 and an impingement location of the illumination light partial beam 9$i$ on the respective specular facet 13 of the specular facet mirror 14 predefine an illumination direction for field points of the object field 3.

At the same time, an edge contour of an impingement region, that is to say—in the case of the entire impingement on a specular facet 13, the edge contour of the specular facet 13 itself, of the illumination light partial beam 9$i$ on the respective specular facet 13 of the specular facet mirror 14 can predefine a field shape of the object field 3. The contour configuration and also the arrangement of the specular facets 13 on the specular facet mirror 14 can therefore include both the information "illumination angle" and the information "field shape" with respect to the illumination of the object field 3.

Each of the specular facets 13 has a continuous static reflection surface 15. The specular facets 13, for their part, are not subdivided into a plurality of individual mirrors, but rather in each case constitute a single, monolithic mirror.

The specular facet mirror 14 is arranged neither in a pupil of the projection exposure apparatus 4 nor in a field plane of the projection exposure apparatus 4.

The specular facets 13 are impinged on with angles of incidence having a small angular bandwidth. The angular bandwidth can be less than 2°. The angular bandwidth is equal to half a total angular bandwidth of angles of incidence which the illumination light partial beam 9$i$ has on the respective specular facet 13. If, by way of example, an illumination light partial beam 9$i$ impinges on one of the specular facets 13 with angles of incidence of between 3° and 7°, the total angular bandwidth is 4° and the angular bandwidth on the specular facet 13 is then 2°.

The angular bandwidth of the angles of incidence on the specular facets 13 can relate to local angles of incidence. A largest angle of incidence and a smallest angle of incidence of the illumination light 9 are then determined for each location on a respective one of the specular facets 13. If illumination light partial beams 9$i$ with an angle of incidence of between 2° and 4° impinge at one location on one of the specular facets 13 and illumination light partial beams 9$i$ with an angle of incidence of between 10° and 12° impinge at another location on the same specular facet 13, then a local total angular bandwidth on this specular facet 13 is 2° and the local angular bandwidth is then 1°. These local bandwidth values make no statement about the magnitude of the angular bandwidth at other, non-adjacent locations on the specular facet 13. If some other angular bandwidth on the specular facet is significantly greater than a local angular bandwidth present at specific locations of this specular facet, then properties of a highly reflective coating of this specular facet 13 can be chosen in a manner dependent on the location on the specular facet 13. In this case, it is possible to achieve a reflectivity of the specular facet which is dependent on the local angular bandwidth and not on an angular bandwidth determined over the entire specular facet 13.

In the case of the embodiment of the illumination system 1 according to FIG. 1, the specular facet mirror 14 is the last optical component that guides the illumination light 9 in the illumination system 1 upstream of the object field 3. In the case of other embodiments (not illustrated) of the illumination system 1, a transfer optical unit, for example a grazing incidence mirror, is situated between the specular facet mirror 14 and the object field in the beam path of the illumination light 9. The grazing incidence mirror can be embodied as a plane mirror without refractive power, but alternatively also as a convexly or concavely curved mirror.

FIG. 1 shows, via a corresponding hatching coding, an assignment of the transfer facets 12 of the transfer facet mirror 11 to the specular facets 13 of the specular facet mirror 14 that are illuminated by the respective transfer facets 12 via the illumination partial beams 9$i$. Since four transfer facets 12 are illustrated by way of example in FIG. 1, four of the total of eight specular facets 13 illustrated in FIG. 1 are hatched in the same way as the transfer facets 12 illuminating them. The other specular facets 13 are either unilluminated or illuminated by other transfer facets 12 (not illustrated). The transfer facets 12 and respectively specular facets 13 used in each case as a result of impingement with the illumination light 9 are also designated hereinafter as used facets.

In actual fact, the number of transfer facets 12 used in each case during the projection exposure and the number of specular facets 13 used in each case during the projection exposure are very much higher than in the schematic illustration according to FIG. 1.

The facet mirrors 11 and 14 are constructed from change subunits 16 in each case overall or at least in sections, the basic construction of the change subunits being identical. Exemplary embodiments of such change subunits 16 are explained in greater detail below on the basis of the example of the facet mirror 11 with reference to FIGS. 2 to 6. With regard to the dimensioning of the respective used facets, the respective change subunit 16 is adapted to the use location thereof within the illumination system 1.

FIG. 2 shows an excerpt from one of the facet mirrors 11 including in each case three change subunits $16_1$, $16_2$ and $16_3$. The arrangement of these change subunits 16 is represented in FIG. 2 on the basis of the example of the transfer facet mirror 11 according to FIG. 1, whose column-by-column facet arrangement 17 of the used facets 12 is likewise illustrated. Each of these used facets 12 is assigned a change subunit $16_i$ according to the type of the change subunits $16_1$, $16_2$, $16_3$. Each of the change subunits $16_i$ has a plurality of change facets, that is to say—in the example of use for the transfer facet mirror 11—a plurality of transfer facets $12_i$, which alternatively can be positioned at the use location of exactly one used facet 12, that is to say within a line of the facet arrangement 17 that is assigned to this change subunit $16_i$. In the case of the arrangement of change subunits $16_1$ to $16_3$ as illustrated in FIG. 2, the facets 12 of the change subunits $16_1$, $16_2$ that are illustrated on the far left in FIG. 2 and also the facet 12 of the change subunit $16_3$ that is illustrated on the far right are arranged in the used facet arrangement 17 and are used as a result of impingement with a respective partial beam $9_i$ of the illumination light 9.

Each of the facets 12 within one of the change subunits $16_i$ has a different configuration of its reflection surface with regard to its tilting angle or its imaging surface shape, in particular its radius of curvature. The facets 12 therefore have different surface topographies. Each of the facets 12 of one of the change subunits $16_i$ is thus designed for an individually assigned reflection geometry and is thus designed for a specific illumination setting.

The used facets 12 are arranged in the facet arrangement 17 line by line within exactly one facet column running along the y-direction. Each of the change subunits $16_i$ includes exactly one facet line. The change facets 12 of each of the change subunits $16_i$ are arranged along this facet line, that is to say are arranged alongside one another in the x-direction. Each of the change subunits $16_i$ can have two, three, four, five, six, seven, eight, nine, ten or even more change facets 12. The facets 12 of the change subunits $16_i$ are arranged on a common facet carrier.

In the y-direction, a distance between two adjacent used facets 12 is at most 2 mm. The distance can be less than 2 mm, can be less than 1.5 mm, can be less than 1 mm and can also be less than 0.5 mm. This distance between adjacent used facets 12 in the y-direction is at most 20% of a y-extent of the used facets. The y-distance between adjacent used facets 12 can be less than 20% of the y-extent of the respective used facet 12, can be less than 15%, can be less than 10% or can be less than 5% of the y-extent.

Each of the change subunits $16_i$ is displaceable individually and independently of the other change subunits $16_j$ along a displacement direction parallel to the x-direction, as indicated by double-headed arrows 18 in FIG. 2. For this displacement, a common facet carrier of each of the change subunits $16_i$ is connected to a dedicated displacement actuator 19, as indicated schematically in FIG. 2. The displacement of the respective change subunit $16_i$ along the displacement direction 18 is guided via a corresponding linear guide (not illustrated in more specific detail).

In the position according to FIG. 2, the used facet 12 of the change subunit $16_1$ reflects the illumination light 9 for example in the direction of the specular facet $13_1$ in FIG. 1. After the displacement of the change subunit $16_1$ in the x-direction by an x-facet extent of the transfer facets 12, the transfer facet $12_{1'}$ thus transferred into the used facet arrangement 17 and illustrated on the right in FIG. 2 is then impinged on by the illumination light 9 for example in the direction of the specular facet $13_{1'}$ of the specular facet mirror 14.

In an alternative embodiment, a respective one of the change subunits 16 includes a plurality of facet lines, for example two, three, four, five or even more facet lines.

In the case of the specular facet mirror 14, as is evident from FIG. 1, a used facet arrangement is not arranged strictly in the y-direction in a column. In the case of the specular facet mirror 14, an arrangement of change subunits 16 is such that an arrangement of the used facets 13 offset relative to one another in the x-direction, as indicated in FIG. 1, is maintained. In the case of the specular facet mirror 14, too, the used facets 13 are arranged transversely, namely in the y-direction, with respect to the line direction x of the change facets 13 arranged line by line.

The concept of the change subunits can also be used in the case of facet mirrors including curved, that is to say arcuate, facets 12 and respectively 13. This is explained below with reference to FIG. 3. This explanation is given once again on the basis of the example of a transfer facet mirror 11. Components and functions corresponding to those which have already been described above with reference to FIGS. 1 and 2 bear the same reference numerals and will not be discussed in detail again.

Figure 3:
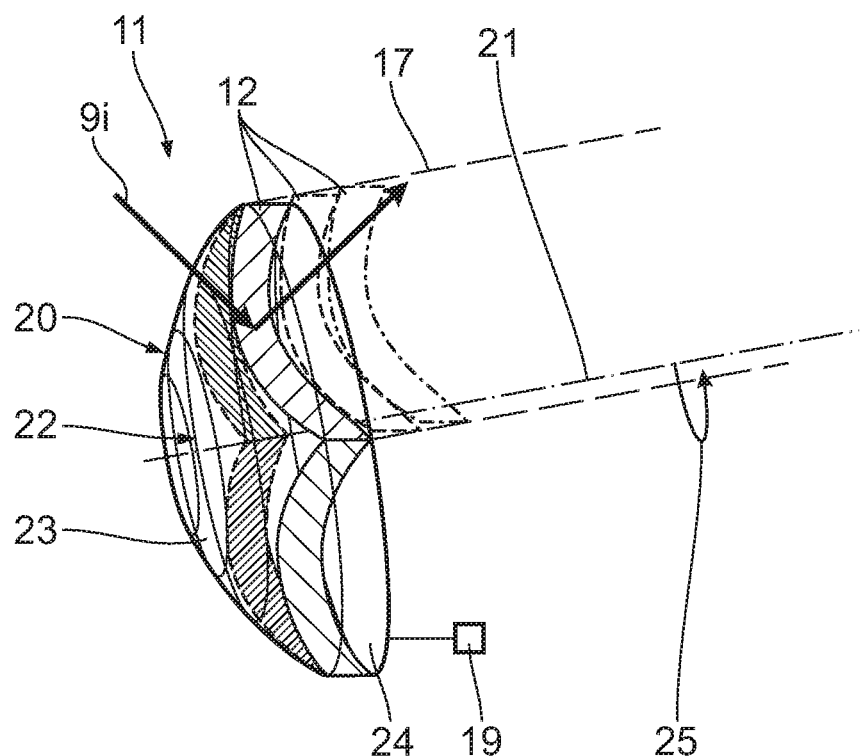
FIG. 3 shows a perspective view of a further embodiment for a change subunit of a facet mirror which can be used in an illumination optical unit for a projection exposure apparatus.

The facet mirror 11 according to FIG. 3 is constructed from a plurality of change subunits 20 which can be used instead of the change subunits 16 according to FIGS. 1 and 2. FIG. 3 illustrates exactly one of these change subunits 20. The latter is pivotable or rotatable about a pivoting or rotation axis 21. The arcuate change facets 12 are arranged in the circumferential direction around the axis 21 and form marginal lateral wall sections of a facet carrier 22 having spherical wall sections 23, 24. Adjacent change subunits 20 can be placed against one another via the spherical wall sections 23, 24, such that the used facets 12 of all the change subunits 20 once again become located in a used facet arrangement 17. This is indicated for another two used facets 12 of adjacent change subunits 20, which are otherwise not illustrated. These two further used facets 12 within the used facet arrangement are schematically illustrated by dashed and dash-dotted lines. As an alternative to a spherical configuration, the edge sections 23, 24 can also be embodied as rotationally symmetrical about the axis 21 in some other way.

Each of the change subunits 20 once again has an individual displacement actuator 19 for pivoting or rotating the change subunit 20 about the axis 21, which is indicated by a pivoting arrow 25 in FIG. 3. Each of the change subunits 20 can have two, three, four, five, six, seven, eight or even more change facets 12.

Once again the different change facets 12 of one of the change subunits 20 have mutually different surface topographies, that is to say in particular different tilting angles and radii of curvature of the reflection surfaces.

Figure 4:
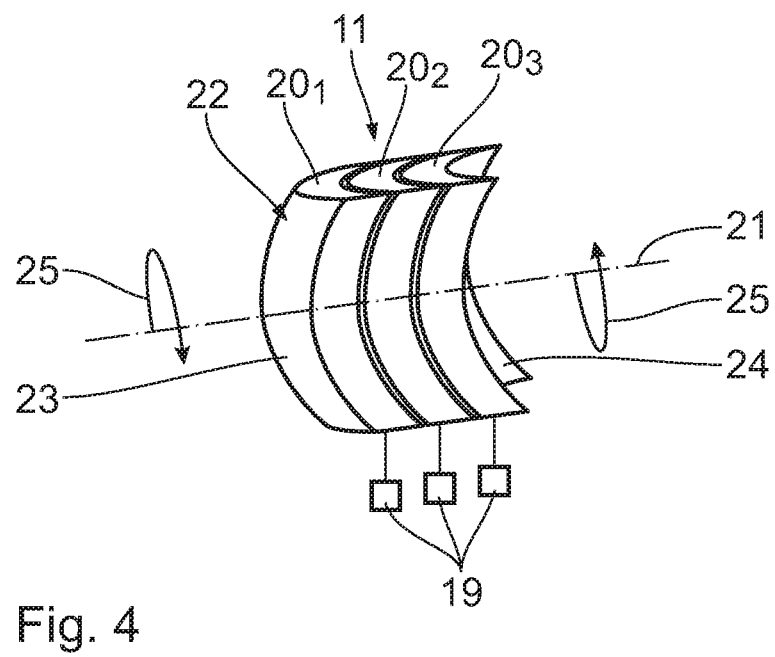
FIG. 4 shows a perspective view of a further embodiment for a change subunit of a facet mirror which can be used in an illumination optical unit for a projection exposure apparatus.

FIG. 4 shows a variant of an excerpt from the transfer facet mirror 11 including a total of three change subunits $20_1$ to $20_3$ according to the type of the change subunit 20 according to FIG. 3. Components and functions corresponding to those which have already been explained above with reference to FIGS. 1 to 3, and in particular with reference to FIG. 3, have the same reference numerals and will not be discussed in detail again.

FIG. 4 illustrates the practically uninterrupted bearing of adjacent change subunits $20_i$ via the spherical wall sections 23, 24 facing one another.

In FIG. 4, the facet carriers 22 are illustrated still as blanks, that is to say without change facets implemented in the lateral wall sections thereof.

Figure 5:
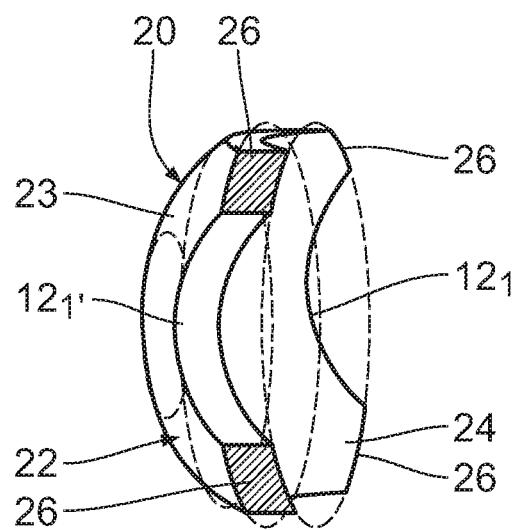
FIG. 5 shows a perspective view of a further embodiment for a change subunit of a facet mirror which can be used in an illumination optical unit for a projection exposure apparatus.

FIG. 5 shows a further embodiment of a change subunit 20 according to the type of the change subunits 20 in FIGS. 3 and 4. Components and functions corresponding to those which have already been explained above with reference to FIGS. 1 to 4, and in particular with reference to FIGS. 3 and 4, bear the same reference numerals and will not be discussed in detail again.

FIG. 5 illustrates the case in which, after two change facets $12_1$, $12_{1'}$ have been incorporated into the lateral wall of the facet carrier 22, corresponding projections 26 of the original raw lateral wall still remain.

Figure 6:
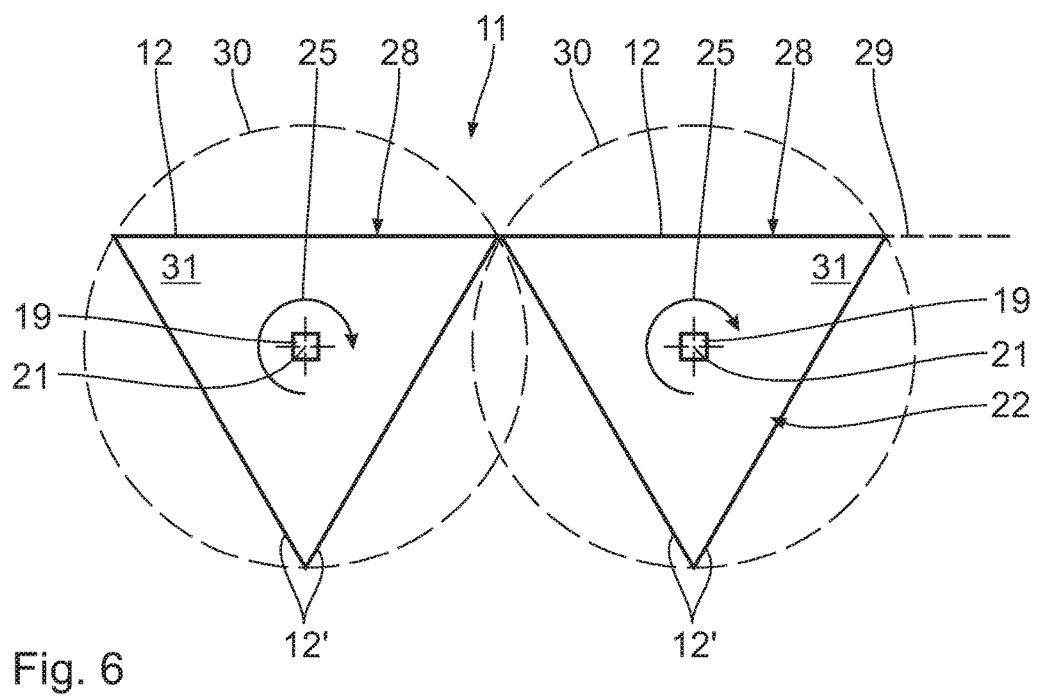
FIG. 6 shows in a side view a further embodiment of a change subunit, wherein two change subunits of this type are illustrated alongside one another.
Figure 7:
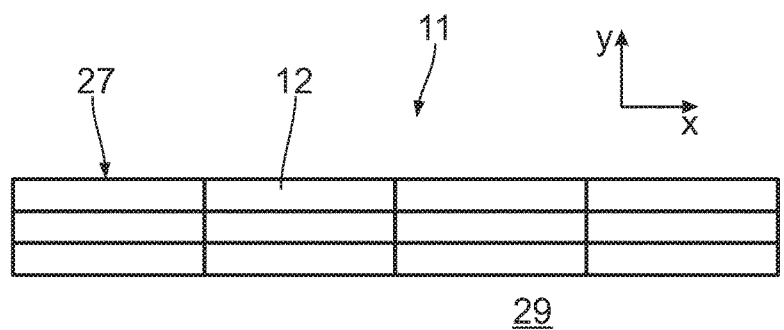
FIG. 7 shows a plan view of a section of a facet mirror which is constructed from change subunits according to FIG. 6.

FIG. 6 shows a further variant of a transfer facet mirror 11 having transfer facets 12 in a used facet arrangement 27, which is illustrated schematically in FIG. 7 on the basis of the example of a 4×3 array. In actual fact, the number of used facets 12 within such an x/y array is very much greater in practice. Examples of such array arrangements of field facets are found in U.S. Pat. No. 6,658,084 B2 (rectangular field facets) and in US 2012/0 293 785 A1 (arcuate field facets). Components and functions corresponding to those which have already been explained above with reference to FIGS. 1 to 5 bear the same reference numerals in FIGS. 6 and 7 and will not be discussed in detail again.

FIG. 6 shows a side view of two change subunits 28, which are individually rotatable in each case about a dedicated pivoting or rotation axis 21 and for this purpose are once again connected in each case to a displacement actuator 19, as likewise indicated in FIG. 6. Each of the change subunits 28 has three facets 12 which are arranged in the circumferential direction around the respective pivoting axis 21 of the change subunit 28 and occupy the positions of the sides of an equilateral triangle in the schematic illustration in FIG. 6. The respective used facets 12 are illustrated at the top in FIG. 6 and lie jointly in a facet arrangement plane 29 of the transfer facet mirror 11, which is perpendicular to the plane of the drawing in FIG. 6. FIG. 6 in turn does not show surface topographies of the facets 12 that are used in practice, but rather schematically plane raw topographies.

The change subunits 28 can be arranged simultaneously along an x-direction and along a y-direction practically in an uninterrupted manner alongside one another. The view according to FIG. 7 shows the 4×3 array arrangement of the used facets 12 in the arrangement plane 29. This used facet arrangement 27 according to FIG. 7 is formed by a total of twelve change subunits 28 which are configured in a corresponding 4×3 array arrangement.

In the case of the change subunits 28, too, a change of the used facets takes place by the pivoting or rotation of the respective facet carrier 22 about the rotation or pivoting axis 21 thereof. Movement paths of outermost corners of the facet carriers 22 are indicated by dashed lines at 30 in FIG. 6. Insofar as one of the two facet carriers 22 remains stationary in the use position shown in FIG. 6, the other of the two facet carriers 22 can be rotated, without the two facet carriers disturbing one another during this movement. In this way, for example, via the pivoting of the facet carrier 22 on the right in FIG. 6 in the clockwise direction (arrow 25), the top used facet 12 in FIG. 6 can be exchanged for a facet 12' having a different surface topography, which is illustrated at the bottom left of FIG. 6.

The facet carriers 22 of the embodiment according to FIG. 6 can have planar end-side wall sections 31 over which change subunits 28 adjacent to one another in the y-direction bear against one another. Alternatively, particularly in the case of a variant of the change subunits 28 including curved facets 12, the facet carriers 22 can once again have spherical wall sections 31 or wall sections 31 curved rotationally symmetrically about the axes 21 in some other way.

In an embodiment which is not illustrated, exclusively the transfer facet mirror is configured with at least one change subunit 16, 20, 28 but not the specular facet mirror.

An actuatability of the facets of the transfer facet mirror 11 makes it possible to alter a direction distribution of the illumination light 9 impinging on the object field 3, a mechanically simple embodiment of the specular facet mirror simultaneously being maintained.

The above-explained concept of the change subunits 16, 20, 28 can also be used in an illumination system which is constructed in the manner of a fly's eye condenser with a field facet mirror and a pupil facet mirror. The correspondingly designed change subunits, in particular according to the type of the change subunit 28, can be used there for the field facets. Examples of such a fly's eye condenser are found in US 2012/0 293 785 A1 and U.S. Pat. No. 6,658,084 B2.

In the case of such a fly's eye condenser configuration, too, it is possible to use a field facet mirror including a single column of field facets according to the type of the transfer facets 12, the field facets lying one above another in the y-direction. This is explained below with reference to FIG. 8. The latter shows a further embodiment of a projection exposure apparatus 32 which can be used instead of the projection exposure apparatus 4 for producing a micro- or nanostructured semiconductor component. Components corresponding to those which have already been explained above with reference to the projection exposure apparatus 4 and the components thereof according to FIGS. 1 to 7 bear the same reference numerals and will not be discussed in detail again.

As indicated in the case of the exemplary embodiment according to FIG. 8, the beam shaping device 10 can have a reflection mirror. A beam shaping surface of the beam shaping device 10, in particular the reflection mirror, can be embodied as a freeform surface.

An illumination system 33 of the projection exposure apparatus 32 which can be used instead of the illumination system 1 has a field facet mirror 34 and a pupil facet mirror 35.

The field facet mirror 34 has a plurality of field facets 12 which are imaged into the object field 3 in a manner being superimposed on one another.

The pupil facet mirror 35, which is arranged in the region of a pupil plane of the projection exposure apparatus 32, has a plurality of pupil facets 36. The latter are arranged at the location of possible pupil spots which arise as images of the radiation source 2 along corresponding object field illumination channels which can be formed via a corresponding tilting adjustment of the field facets 12. A location distribution of pupil facets 36 illuminated in each case with an illumination light partial beam 9i predefines an illumination angle distribution of the illumination light 9 in the object field 3. In contrast to the illumination system 1 according to FIG. 1, in the case of the illumination system 33 according to FIG. 8, a reflective optical component, namely the pupil facet mirror 35 is arranged in the pupil plane.

The superimposing imaging of the field facets 12 in the object field 3 is carried out via the pupil facets 36.

In order to produce a nano- or microstructured component, for example a semiconductor memory chip, the reticle 5 and the wafer 8 having a coating which is light-sensitive to the illumination light 9 are firstly provided. At least one section of the reticle 5 is then projected onto the wafer 8 with the aid of the projection exposure apparatus 4. Afterwards, the light-sensitive layer on the wafer 8 that has been exposed with the illumination light 9 is developed.

Depending on the structure arrangement on the reticle 5 or depending on the desired resolution capability, a corresponding illumination setting is selected via a corresponding selection of the illuminated specular facets 13 or the pupil facets 25. This is carried out via corresponding positioning of the used facets of the change subunits 16 or 20 or 28, and that is to say via corresponding driving of the displacement actuators 19 via the central control device 4a.

What is claimed is:

1. An illumination optical unit, comprising:
   a field facet mirror, comprising:
      a plurality of used facets; and
      a change subunit comprising a plurality of change facets and a facet carrier,
   wherein:
      each used facet is configured to reflect an illumination light partial beam when the field facet mirror is used in an optical unit for projection lithography;
      the change facets are arranged jointly on a facet carrier;
      for each change facet, the change facet is positionable alternatively at a location of use of exactly one of the used facets;
      for a first used facet that is changeable via the change subunit:
         along a direction, there is a distance between the first used facet and a used facet that is not changeable via the change subunit; and
         along the direction, a used facet that is adjacent to the first used facet has an extent that is at least five times the distance; and
      the illumination optical unit is an illumination optical unit for projection lithography.

2. The illumination optical unit of claim 1, wherein:
   the change subunit has a facet line in a line direction;
   the change facets are arranged along the facet line;
   the used facets are arranged transversely with respect to the line direction.

3. The illumination optical unit of claim 1, wherein the change subunit is pivotable about a pivoting axis, and the change facets are arranged in a circumferential direction around the pivoting axis of the change subunit.

4. The illumination optical unit of claim 3, wherein the change subunit comprises a facet carrier comprising rotationally symmetrical wall sections by which adjacent change subunits are placeable against one another.

5. The illumination optical unit of claim 3, wherein the field facet mirror comprises a plurality of pivotable change subunits arranged in a two-dimensional array.

6. The illumination optical unit of claim 1, further comprising a pupil facet mirror.

7. An illumination system, comprising:
   an EUV source; and
   an illumination optical unit according to claim 1,
   wherein the illumination system is an illumination system for projection lithography.

8. The illumination system of claim 7, further comprising a pupil facet mirror.

9. An optical system, comprising:
   an illumination optical unit configured to illuminate an object field; and
   a projection optical unit configured to image the object field into an image field,
   wherein:
      the illumination optical unit comprises an illumination optical unit according to claim 1; and
      the optical system is an optical system for projection lithography.

10. An apparatus, comprising:
    an EUV source;
    an illumination optical unit configured to illuminate an object field; and
    a projection optical unit configured to image the object field into an image field,
    wherein:
       the illumination optical unit comprises an illumination optical unit according to claim 1; and
       the apparatus is a lithography projection exposure apparatus.

11. The illumination optical unit of claim 1, comprising:
    a transfer facet mirror; and
    a specular facet mirror arranged at a distance from a pupil plane,
    wherein the field facet mirror comprises at least one member selected from the group consisting of the transfer facet mirror and the specular facet mirror.

12. An illumination system, comprising:
    an EUV light source; and
    the illumination optical unit according to claim 1, comprising:
       a transfer facet mirror; and
       a specular facet mirror arranged at a distance from a pupil plane,
    wherein:
       the field facet mirror comprises at least one member selected from the group consisting of the transfer facet mirror and the specular facet mirror; and
       the illumination system is an illumination system for projection lithography.

13. An optical system, comprising:
    an illumination optical unit configured to illuminate an object plane; and
    a projection optical unit configured to image the object field into an image field,
    wherein:
       the illumination optical unit comprises an illumination optical unit according to claim 1;
       the illumination optical unit comprises a transfer facet mirror and a specular facet mirror;

the specular facet mirror is arranged at a distance from a pupil plane;
the field facet mirror comprises at least one member selected from the group consisting of the transfer facet mirror and the specular facet mirror; and
the optical system is an optical system for projection lithography.

14. An apparatus, comprising:
an EUV system;
an illumination optical unit configured to illuminate an object plane; and
a projection optical unit configured to image the object field into an image field,
wherein:
the illumination optical unit comprises an illumination optical unit according to claim 1;
the illumination optical unit comprises a transfer facet mirror and a specular facet mirror;
the specular facet mirror is arranged at a distance from a pupil plane;
the field facet mirror comprises at least one member selected from the group consisting of the transfer facet mirror and the specular facet mirror; and
the apparatus is a lithography projection exposure apparatus.

15. A method of using a lithography projection exposure apparatus comprising an illumination optical unit and a projection optical unit, the method comprising:
using the illumination optical unit to illuminate a reticle in an object field; and
using the projection optical unit to project an image of the illuminated reticle into an image field,
wherein the illumination optical unit comprises an illumination optical unit according to claim 1.

16. An illumination optical unit, comprising:
a field facet mirror, comprising:
a plurality of used facets; and
a plurality of change subunits, each subunit comprising a plurality of change facets and a facet carrier,
wherein:
each used facet is configured to reflect an illumination light partial beam when the field facet mirror is used in an optical unit for projection lithography;
the change facets are arranged jointly on a facet carrier;
each change facet is replacable for exactly one of the used facets at a location of use of the used facet;
for a first used facet that is changeable via the change subunit:
along a direction, there is a distance between the first used facet and a used facet that is not changeable via the change subunit; and
along the direction, a used facet that is adjacent to the first used facet has an extent that is at least five times the distance; and
the illumination optical unit comprises an illumination optical unit for projection lithography.

17. The illumination optical unit of claim 6, wherein for each change subunit:
the change subunit is pivotable about a pivoting axis;
the change facets of the change subunit are arranged in a circumferential direction around the pivoting axis of the change subunit; and
the change subunit comprises a facet carrier comprising rotationally symmetrical wall sections by which adjacent change subunits are placeable against one another.

18. The illumination optical unit of claim 16, further comprising a pupil facet mirror.

19. The illumination optical unit of claim 1, wherein the distance along the direction is less than 15% of the extent of the adjacent used facet along the direction.

20. The illumination optical unit of claim 1, wherein the distance along the direction is at most 2 mm.

21. The illumination optical unit of claim 16, wherein the distance along the direction is less than 15% of the extent of the adjacent used facet along the direction.

22. The illumination optical unit of claim 16, wherein the distance along the direction is at most 2 mm.

* * * * *

UNITED STATES PATENT AND TRADEMARK OFFICE
CERTIFICATE OF CORRECTION

| | |
|---|---|
| PATENT NO. | : 10,216,091 B2 |
| APPLICATION NO. | : 15/436140 |
| DATED | : February 26, 2019 |
| INVENTOR(S) | : Markus Deguenther and Michael Patra |

It is certified that error appears in the above-identified patent and that said Letters Patent is hereby corrected as shown below:

In the Specification

Column 1, Line 49, delete "facets" and insert -- facets. --.

Column 4, Line 18, delete "et endue" and insert -- etendue --.

Column 4, Line 19, delete "et endue" and insert -- etendue --.

In the Claims

Column 14, Line 18, in Claim 17, delete "claim 6," and insert -- claim 16, --.

Signed and Sealed this
Fourteenth Day of July, 2020

Andrei Iancu
*Director of the United States Patent and Trademark Office*